(12) United States Patent
Ohta et al.

(10) Patent No.: US 8,578,774 B2
(45) Date of Patent: Nov. 12, 2013

(54) PHYSICAL QUANTITY SENSOR INCLUDING BONDING WIRE WITH VIBRATION ISOLATION PERFORMANCE CHARACTERISTICS

(75) Inventors: Tameharu Ohta, Takahama (JP); Takeshi Shinoda, Nagoya (JP); Itaru Ishii, Okazaki (JP); Keisuke Nakano, Nukata (JP)

(73) Assignee: DENSO CORPORATION, Kariya (JP)

( * ) Notice: Subject to any disclaimer, the term of this patent is extended or adjusted under 35 U.S.C. 154(b) by 299 days.

(21) Appl. No.: 13/004,295

(22) Filed: Jan. 11, 2011

(65) Prior Publication Data
US 2011/0167912 A1 Jul. 14, 2011

(30) Foreign Application Priority Data
Jan. 13, 2010 (JP) ................................ 2010-004871

(51) Int. Cl.
G01P 1/02 (2006.01)
G01P 15/125 (2006.01)
G01C 19/56 (2012.01)

(52) U.S. Cl.
USPC ........................ 73/493; 73/504.12; 73/514.32

(58) Field of Classification Search
USPC ............ 73/493, 504.12, 504.14, 514.32, 510, 73/511
See application file for complete search history.

(56) References Cited

U.S. PATENT DOCUMENTS

| | | | |
|---|---|---|---|
| 5,986,335 A | 11/1999 | Amagai | |
| 6,748,807 B2 * | 6/2004 | Yoshiuchi et al. | 73/493 |
| 6,810,736 B2 * | 11/2004 | Ikezawa et al. | 73/493 |
| 6,979,873 B2 * | 12/2005 | Fujii | 257/417 |
| 7,234,364 B2 * | 6/2007 | Ohta | 73/862.08 |
| 7,263,885 B2 * | 9/2007 | Goto | 73/514.32 |
| 7,513,154 B2 * | 4/2009 | Ino | 73/493 |
| 7,540,190 B2 * | 6/2009 | Sasaki | 73/493 |
| 7,571,647 B2 * | 8/2009 | Takemasa et al. | 73/493 |
| 8,250,920 B2 * | 8/2012 | Yamanaka et al. | 73/510 |
| 2002/0063332 A1 | 5/2002 | Yamaguchi et al. | |
| 2008/0066546 A1 * | 3/2008 | Katsumata | 73/504.12 |
| 2009/0282915 A1 * | 11/2009 | Ohta et al. | 73/504.12 |
| 2010/0307242 A1 * | 12/2010 | Sakai et al. | 73/504.12 |

FOREIGN PATENT DOCUMENTS

| | | |
|---|---|---|
| JP | A-62-140427 | 6/1987 |
| JP | A-H06-132347 | 5/1994 |
| JP | A-H06-287665 | 10/1994 |
| JP | A-H07-176558 | 7/1995 |

(Continued)

OTHER PUBLICATIONS

Office Action dated Jan. 4, 2012 issued from the Japan Patent Office for corresponding Japanese patent application No. 2010-4871 (English translation enclosed).

Primary Examiner — Helen Kwok
(74) Attorney, Agent, or Firm — Posz Law Group, PLC

(57) ABSTRACT

A physical quantity sensor includes a sensing portion, a casing, a vibration isolating member, an electrically conductive portion, a pad and a bonding wire. The casing encases the sensing portion therein. The vibration isolating member is disposed between the sensing portion and the casing to reduce a relative vibration between the sensing portion and the casing. The bonding wire electrically connects the electrically conductive portion provided on the casing and the pad provided on a surface of the sensing portion. The bonding wire extends from the pad to the electrically conductive portion and includes a bend. The bonding wire is configured to satisfy a relation of $20 \times d \leq h$, in which d is an outer diameter of the bonding wire, and h is a dimension of the bonding wire with respect to a direction perpendicular to the surface of the sensing portion.

5 Claims, 15 Drawing Sheets

(56) References Cited

FOREIGN PATENT DOCUMENTS

| | | |
|---|---|---|
| JP | A-H10-233410 | 9/1998 |
| JP | A-H10-270485 | 10/1998 |
| JP | A-H11-3964 | 1/1999 |
| JP | A-H11-26496 | 1/1999 |
| JP | A-H11-111750 | 4/1999 |
| JP | 2000-311916 A | 11/2000 |
| JP | A-2000-340597 | 12/2000 |
| JP | A-2002-5955 | 1/2002 |
| JP | A-2003-28647 | 1/2003 |
| JP | A-2003-68782 | 3/2003 |
| JP | A-2003-315047 | 11/2003 |
| JP | A-2004-87831 | 3/2004 |
| JP | A-2006-78101 | 3/2006 |
| JP | A-2006-317321 | 11/2006 |
| JP | A-2007-33393 | 2/2007 |
| JP | A-2007-57238 | 3/2007 |
| JP | 2007-212174 A | 8/2007 |
| JP | 2009-085837 A | 4/2009 |
| JP | A-2009-94302 | 4/2009 |
| JP | A-2010-181392 | 8/2010 |
| WO | WO 2009/093554 A1 | 7/2009 |
| WO | WO 2011/024819 A1 | 3/2011 |

* cited by examiner

FIG. 8A

|  | CONTROL FACTOR | | |
|---|---|---|---|
|  | L1 | L2 | L3 |
| LEVEL 1 | 0 | 0.4 | 2.6 |
| LEVEL 2 | 1.0 | 0.6 | 3.2 |
| LEVEL 3 | 2.0 | 0.8 | 3.8 |

FIG. 8B

|  | ERROR FACTOR |
|---|---|
|  | N |
|  | L3 VARIATIONS |
| LEVEL 1 | L3−0.1 |
| LEVEL 2 | L3+0.1 |

FIG. 9

| L9 ORTHOGONAL ARRAY | | | | | | | | |
|---|---|---|---|---|---|---|---|---|
| No. | A: L1 | B: L2 | C: | D: L3 | A | B | C | D |
| 1 | 0.0 | 0.4 | e | 2.6 | 1 | 1 | 1 | 1 |
| 2 | 1.0 | 0.6 | e | 2.6 | 2 | 2 | 2 | 1 |
| 3 | 2.0 | 0.8 | e | 2.6 | 3 | 3 | 3 | 1 |
| 4 | 0.0 | 0.6 | e | 3.2 | 1 | 2 | 3 | 2 |
| 5 | 1.0 | 0.8 | e | 3.2 | 2 | 3 | 1 | 2 |
| 6 | 2.0 | 0.4 | e | 3.2 | 3 | 1 | 2 | 2 |
| 7 | 0.0 | 0.8 | e | 3.8 | 1 | 3 | 2 | 3 |
| 8 | 1.0 | 0.4 | e | 3.8 | 2 | 1 | 3 | 3 |
| 9 | 2.0 | 0.6 | e | 3.8 | 3 | 2 | 1 | 3 |

PHYSICAL QUANTITY SENSOR INCLUDING BONDING WIRE WITH VIBRATION ISOLATION PERFORMANCE CHARACTERISTICS

CROSS REFERENCE TO RELATED APPLICATION

This application is based on Japanese Patent Application No. 2010-4871 filed on Jan. 13, 2010, the disclosure of which is incorporated herein by reference.

FIELD OF THE INVENTION

The present invention relates to a physical quantity sensor. More particularly, the present invention relates to a physical quantity sensor having a sensing portion held in a casing.

BACKGROUND OF THE INVENTION

A physical quantity sensor has a sensing portion formed with a substrate such as a semiconductor substrate or a ceramic substrate. The sensing portion is held in a casing made of a resin, for example. The sensing portion detects a physical quantity, such as angular velocity, acceleration, and turning power, based on a change in an electrical capacitance, a voltage, or the like.

In such a physical quantity sensor, if a vibration of the casing is transmitted to the sensing portion, a noise contained in an output of the sensing portion increases. Therefore, a vibration isolation structure is needed between the sensing portion and the casing to reduce a relative vibration between the sensing portion and the casing.

For example, Japanese Patent Application Publication No. 2007-212174 describes an angular velocity sensor having a resin spring as a vibration isolation structure. The resin spring is located between a casing and a sensing portion. The resin spring supports the sensing portion to the casing to reduce a relative vibration between the sensing portion and the casing.

In fact, the sensing portion is small. In order to ensure sufficient vibration isolation performance for such a small sensing portion, the resin spring needs to have a small spring constant. However, high accuracy is required to form a resin spring with a small spring constant. Further, it is difficult to ensure sufficient structural strength of the resin spring.

Further, in the sensor of the publication, flexible bonding wires are employed for electrically connecting the casing and the sensing portion. If the casing and the sensing portion are displaced relative to each other, the bonding wires are deformed or strained, and hence structural strength and durability of the bonding wires are degraded. To ensure the structural strength and the durability of the bonding wires, it is considered to increase the stiffness of the bonding wires such as by increasing the outer diameter of the bonding wires. Such a measurement, however, will affect the vibration isolation performance, and thus it may be difficult to achieve desirable vibration isolation performance.

SUMMARY OF THE INVENTION

The present invention is made in view of the aforementioned drawbacks, and it is an object of the present invention to provide a physical quantity sensor having a bonding wire with improved structural strength and durability while ensuring sufficient vibration isolation performance.

According to an aspect of the present invention, a physical quantity sensor includes a sensing portion having an end wall, a casing, a vibration isolating member, an electrically conductive portion, a pad, and a bonding wire. The casing has a support portion for supporting the sensing portion. The support portion has a support surface opposed to the end wall of the sensing portion. The vibration isolating member is disposed between the end wall of the sensing portion and the support surface of the support portion to join the sensing portion to the casing. The vibration insulating member is configured to reduce a relative vibration between the sensing portion and the casing. The electrically conductive portion is provided on the casing. The pad is provided on the sensing portion. The bonding wire electrically connects the electrically conductive portion and the pad. The bonding wire extends from the pad to the electrically conductive portion while bending opposite to the support surface. The bonding wire is configured to satisfy a relation of $20 \times d \leq h$, in which d is an outer diameter of the bonding wire and h is a height of the bonding wire from the pad to a furthest point of the bend from the pad with respect to a direction perpendicular to the support surface. In the structure, the vibration isolating member is disposed between the support portion and the end wall of the sensing portion. The relative vibration between the casing and the sensing portion is reduced by the vibration isolating member. Further, the bonding wire is configured so that deformation of the bonding wire is reduced even if a relative displacement between the sensing portion and the casing occurs. Accordingly, structural strength and durability of the bonding wire improve, and vibration isolation performance is ensured.

According to a second aspect of the present invention, a physical quantity sensor includes a sensing portion, a casing, a vibration isolating member, an electrically conductive portion, a pad, and a bonding wire. The casing encases the sensing portion therein. The casing provides a clearance between an inner surface thereof and an outer wall of the sensing portion. The vibration isolating member is disposed in at least a portion of the clearance to join the sensing portion to the casing. The vibration isolating member is configured to reduce a relative vibration between the sensing portion and the casing. The electrically conductive portion is provided on the casing. The pad is provided on a surface of the sensing portion. The bonding wire electrically connects the electrically conductive portion and the pad. The bonding wire extends from the pad to the electrically conductive portion and includes a bend. The bonding wire is configured to satisfy a relation of $20 \times d \leq h$, in which d is an outer diameter of the bonding wire, and h is a height of the bonding wire from the pad to a furthest point of the bend from the pad with respect to a direction perpendicular to the surface of the sensing portion.

In the structure, the vibration isolating member is disposed between the sensing portion and the casing to join the sensing portion to the casing. The relative vibration between the casing and the sensing portion is reduced by the vibration isolating member. Further, the bonding wire is configured so that deformation of the bonding wire is reduced even if a relative displacement between the sensing portion and the casing occurs. Accordingly, structural strength and durability of the bonding wire improve, and vibration isolation performance is ensured.

According to a third aspect of the present invention, a physical quantity sensor includes a sensing portion, a casing, a vibration isolating member, an electrically conductive portion, a pad and a bonding wire. The casing encases the sensing portion therein. The vibration isolating member is disposed between the sensing portion and the casing to hold the sensing portion within the casing and to reduce a relative vibration between the sensing portion and the casing. The electrically conductive portion is provided on the casing. The pad is provided on a surface of the sensing portion. The bonding wire electrically connects the electrically conductive portion and the pad. The bonding wire extends from the pad substantially perpendicular to the surface of the sensing portion, bends to extend substantially parallel to the surface of the sensing portion, and connects to the electrically conductive portion. The bonding wire is configured to satisfy a relation of 20×d≤h, in which d is an outer diameter of the bonding wire, and h is a dimension of the bonding wire from the pad to a furthest point of a bend with respect to a direction perpendicular to the surface of the sensing portion.

In the structure, the vibration isolating member is disposed between the sensing portion and the casing to join the sensing portion to the casing. The relative vibration between the casing and the sensing portion is reduced by the vibration isolating member. Further, the bonding wire is configured so that deformation of the bonding wire is reduced even if a relative displacement between the sensing portion and the casing occurs. Accordingly, structural strength and durability of the bonding wire improve, and vibration isolation performance is ensured.

BRIEF DESCRIPTION OF THE DRAWINGS

Other objects, features and advantages of the present invention will become more apparent from the following detailed description made with reference to the accompanying drawings, in which like parts are designated by like reference numbers and in which:

FIGS. 8A and 8B are graphs showing simulation conditions according to the first embodiment;

FIG. 9 is a graph showing simulation conditions according to the first embodiment;

DETAILED DESCRIPTION OF EXEMPLARY EMBODIMENTS

Hereinafter, embodiments of the present invention will be described with reference to the drawings. Like parts are designated by like reference numbers, and a description thereof will not be repeated.

(First Embodiment)

Figure 1A:
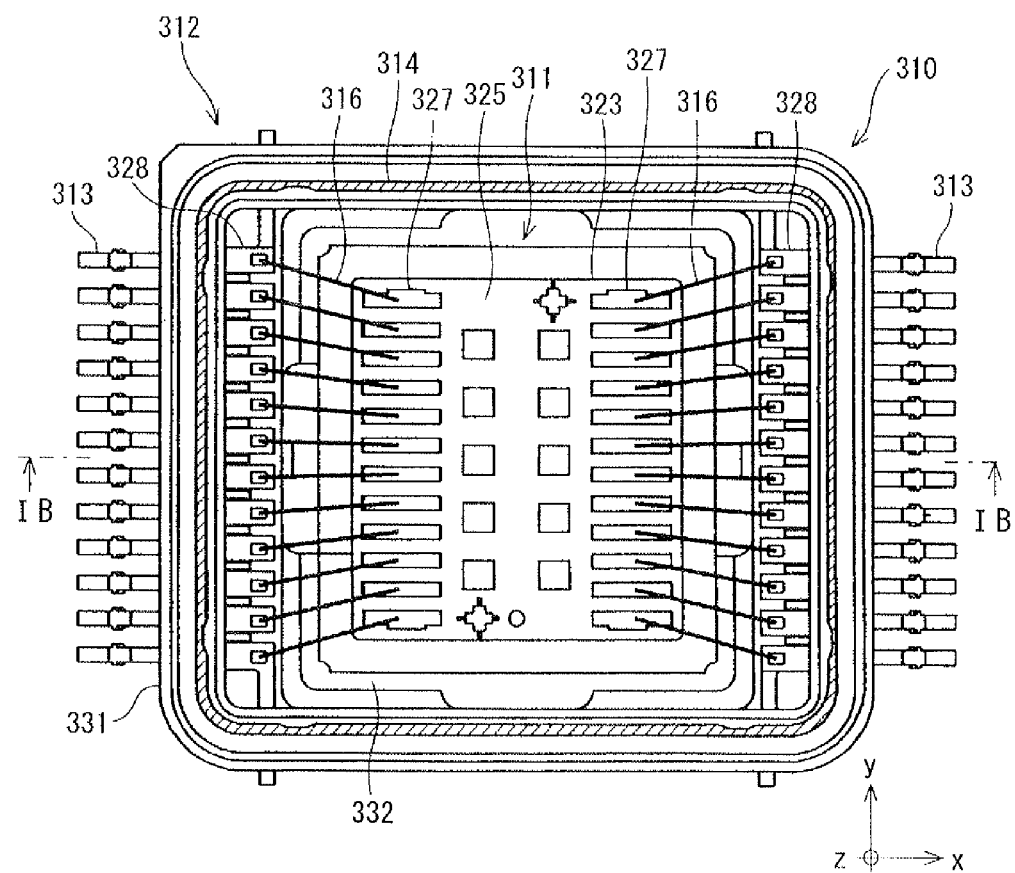
FIG. 1A is a schematic plan view of a physical quantity sensor, partially including a cross-section, according to a first embodiment of the present invention.
Figure 1B:
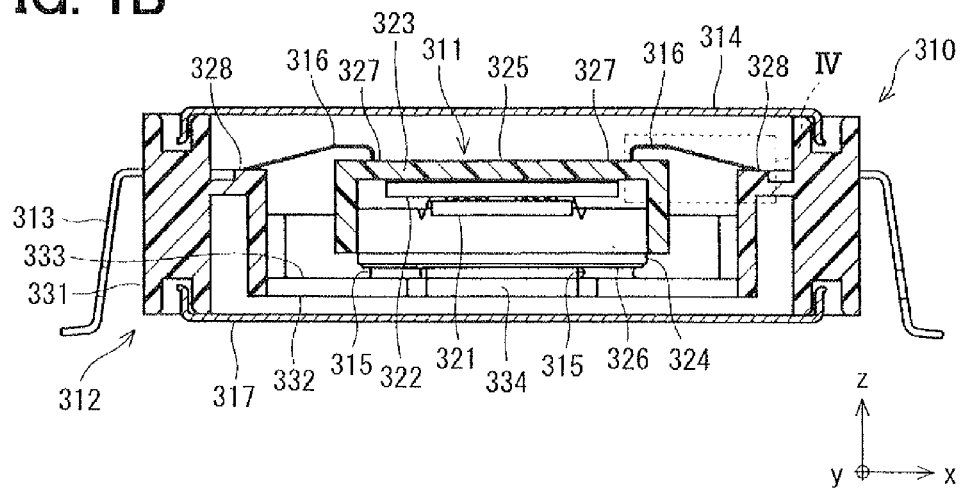
FIG. 1B is a schematic cross-sectional view taken along a line IB-IB in FIG. 1A.
Figure 2:
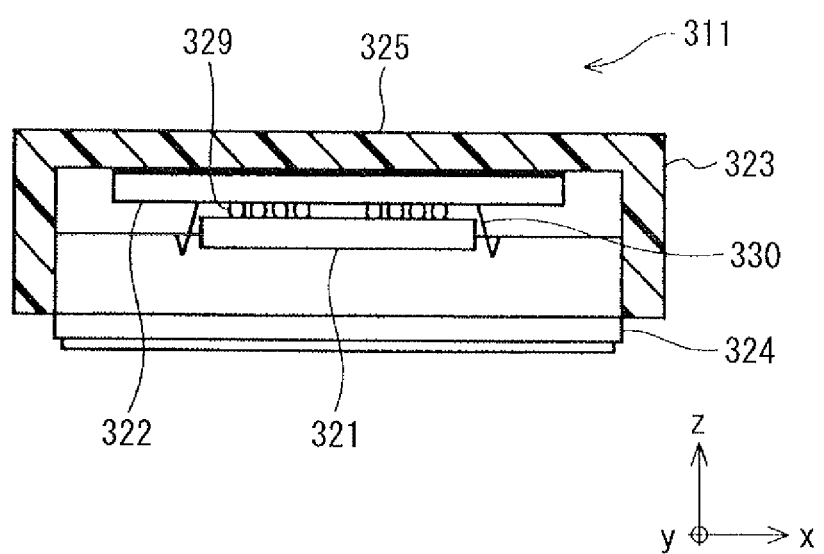
FIG. 2 is a schematic cross-sectional view of an inner unit of the physical quantity sensor according to the first embodiment.

FIGS. 1A and 1B show a physical quantity sensor 310 according to a first embodiment of the present invention. The physical quantity sensor 310 includes an inner unit 311 as a sensing portion, a casing 312, lead frames 313, a cover 314, a vibration isolating member 315, bonding wires 316, and a cover 317. As shown in FIG. 2, the inner unit 311 includes a sensor chip 321, a signal processing chip 322, a housing body 323 and a lid 324.

The physical quantity sensor 310 is applicable to any one of an angular velocity sensor, an acceleration sensor and an inertia force sensor. That is, the physical quantity sensor 310 can be configured to be any one of the angular velocity sensor, the acceleration sensor and the inertia force sensor. The angular velocity sensor detects an angular velocity in a direction of rotation centering an axis of the sensing portion. The acceleration sensor detects an acceleration applied to the sensing portion. The inertia force sensor is a compound sensor in which the angular velocity sensor and the acceleration sensor are combined, and detects an angular velocity and an acceleration.

Figure 3:
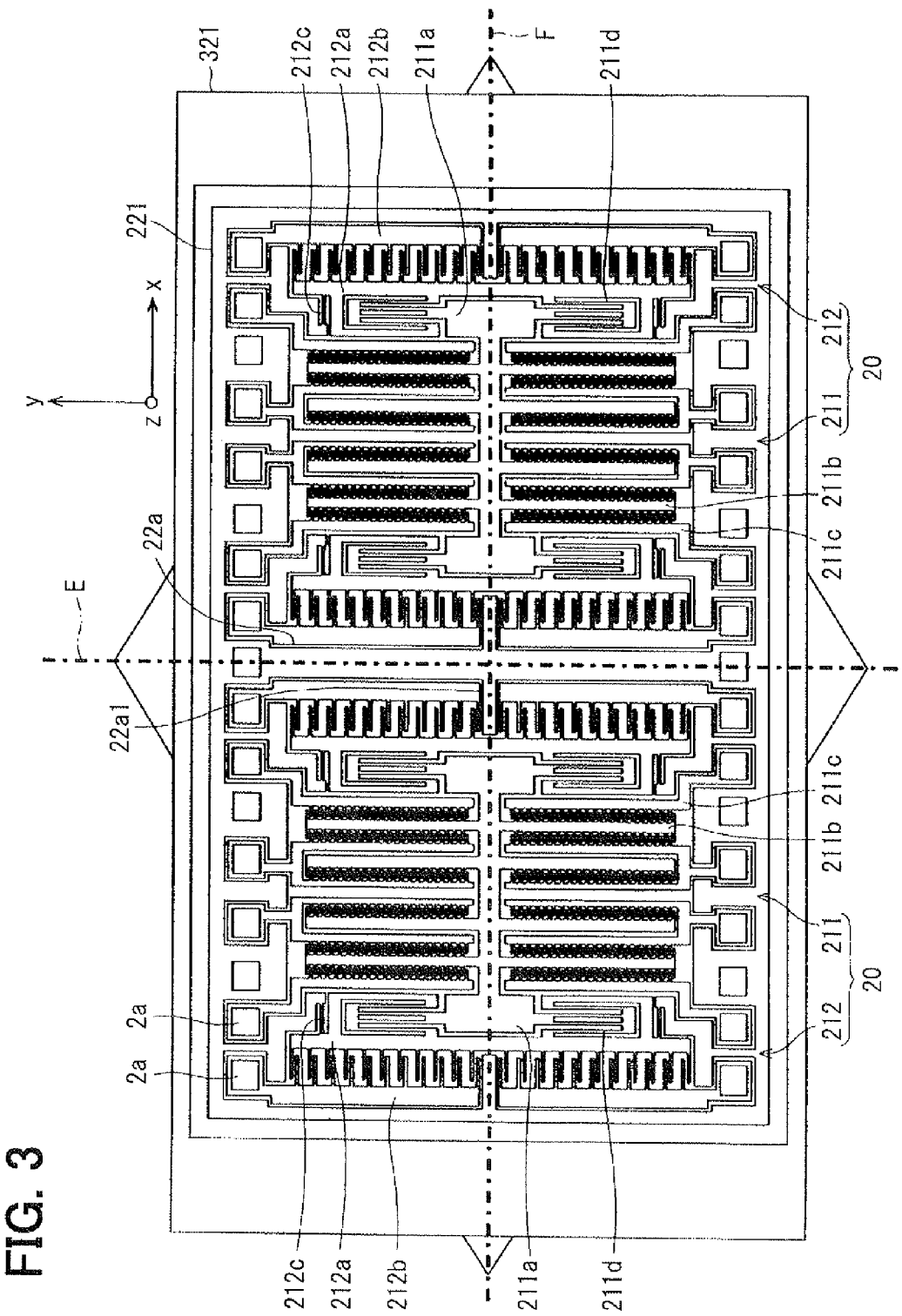
FIG. 3 is a schematic plan view of a sensor chip of the physical quantity sensor according to the first embodiment.

FIG. 3 shows the sensor chip 321 of the inner unit 311. The sensor chip 321 has an area of twenty square millimeters (20 mm$^2$). The sensor chip 321 includes a pair of sensor elements 20. The sensor elements 20 are supported by a peripheral portion 221 in such a manner that the sensor elements 20 are symmetric with respect to a first centerline E, such as a vertical centerline in FIG. 3. The peripheral portion 221 is a rectangular frame, and is held at a ground potential.

Hereinafter, a structure of the sensor elements 20 will be described. Since the sensor elements 20 have the same structure, a description will be made with regard to one of the sensor elements 20. The sensor element 20 includes a driving part 211 and a detecting part 212.

The driving part 211 includes a weight portion 211a, movable driving electrodes 211b and fixed driving electrodes 211c. The driving part 211 is symmetric with respect to a second centerline F, such as a horizontal centerline in FIG. 3. The weight portion 211a is supported such that the weight portion 211a can be displaced relative to the peripheral portion 221. The movable driving electrodes 211b are comb-shaped electrodes. The movable driving electrodes 211b connect to the weight portion 211a. The fixed driving electrodes 211c are comb-shaped electrodes. The fixed driving electrodes 211c are parallel to and opposed to the movable driving electrodes 211b across predetermined intervals for driving the movable driving electrodes 211b at a predetermined frequency.

The detecting part 212 includes movable detecting electrodes 212a and fixed detecting electrodes 212b. The detecting part 212 is symmetric with respect to the second centerline F. The movable detecting electrodes 212a are supported such that the movable detecting electrodes 212a can be displaced relative to the peripheral portion 221. The fixed detecting electrodes 212b are comb-shaped electrodes. The fixed detecting electrodes 212b are parallel to and opposed to the movable detecting electrodes 212a across predetermined intervals. The fixed detecting electrodes 212b detect Coriolis force corresponding to an angular velocity acting on the sensor chip 321.

It is noted that the movable driving electrodes 211b can be displaced in directions along an X axis shown in FIG. 3, and the movable detecting electrodes 212a can be displaced in directions along a Y axis shown in FIG. 3. The Y axis is perpendicular to the X axis and a Z axis.

Specifically, detecting beams 212c are integrally connected to the peripheral portion 221. The movable detecting electrodes 212a are integrally connected to the detecting beams 212c. Further, driving beams 211d are integrally connected to the movable detecting electrodes 212a, and the weight portion 211a are integrally connected to the driving beams 211d.

The peripheral portion 22a includes a cross-shaped reinforcement 22a between the sensor elements 20. The center of the cross of the reinforcing portion 22a coincides with the center of the sensor chip 321 at which the first centerline E and the second centerline F intersect. The reinforcement 22a includes an X-axis portion 22a1 extending along the X axis, that is, extending in a longitudinal direction of the weight portion 211a. The X-axis portion 22a1 is located at a position corresponding to the middle of the fixed detecting electrodes 212b. Bonding pads 2a are formed on the peripheral portion 221 and each of the electrodes.

Next, an angular velocity detecting operation of the sensor chip 321 will be described.

Firstly, a periodic voltage signal is applied between the fixed driving electrodes 211c and the movable driving electrodes 211b to cause the weight portion 211a to vibrate in directions along the X axis. If an angular velocity about the Z axis as an axis of rotation is applied to the sensor chip 321 while the weight portion 211a is vibrating in the directions along the X axis, Coriolis force acts on the weight portion 211. Thus, the weight portion 211a tries to displace in directions along the Y axis. As a result, the detecting beams 212c are deflected in the directions along the Y axis, and the weight portion 211a, the movable driving electrodes 211b and the movable detecting electrodes 212a are displaced in the directions along the Y axis.

The displacement of the weight portion 211a in the directions along the Y axis is transmitted to the movable detecting electrodes 212a through the driving beams 211d. At this time, since a predetermined voltage is applied between the movable detecting electrode 212a and the fixed detecting electrode 212b, a capacitance between the movable detecting electrode 212a and the fixed detecting electrode 212b changes in accordance with the displacement of the movable detecting electrode 212a. A change in the capacitance is measured by a capacitance-to-voltage (CV) converter included in the signal processing chip 322, and the angular velocity applied to the sensor chip 321 is detected based on the measured capacitance change.

Each of the fixed detecting electrodes 212b and each of the movable detecting electrodes 212a are arranged parallel to at least one of sides of the sensor chip 321 on a plane of the sensor chip 321. That is, the change in the capacitance between the fixed detecting electrode 212b and the movable detecting electrode 212a is caused by the displacement of the movable detecting electrode 212a in the direction of the side of the sensor chip 321.

In order to reduce an effect such as external vibration noise, for example, the weight portions 211a of the two sensor elements 20 are vibrated in opposite directions along the X axis. That is, one of the sensor elements 20 is displaced in a plus direction along the X axis, while the other of the sensor elements 20 is displaced in a minus direction along the X axis. In this case, when the angular velocity is applied to the sensor chip 321, the one of the sensor elements 20 is displaced in a plus direction along the Y axis, and the other of the sensor elements 20 is displaced in a minus direction along the Y axis.

The sensor element 20 shown in FIG. 3 has a so-called "external-detect and internal-drive" structure in which the detecting part 212 is connected to and supported by the peripheral portion 221 and the driving part 211 is supported by the peripheral portion 221 through the detecting part 212. As another example, the sensor element 20 may have a so-called "external-drive and internal-detect" structure in which the driving part 211 is connected to and supported by the peripheral portion 221 and the detecting part 212 is supported by the peripheral portion 221 through the driving part 211.

The signal processing chip 322 performs signal processing on the capacitance or voltage change detected by the aforementioned sensor chip 321 and adjusts a voltage applied to the sensor chip 321. The sensor chip 321 and the signal processing chip 322 are, for example, formed on silicon or ceramic substrates.

The physical quantity sensor 310 having the aforementioned structure is, for example, mounted on a vehicle to detect the behavior of vehicle, such as acceleration and turning. In the above description regarding the sensor chip 321 shown in FIG. 3, the structure and operation are exemplified as for the angular velocity sensor that detects an angular velocity as an object of detection. However, the object of detection is not limited to the angular velocity, but may be acceleration in direction(s) along the X axis and/or Y axis. Also, the signal processing chip 322 may have arbitrary functions in accordance with use of the physical quantity sensor 310.

The sensor chip 321 and the signal processing chip 322 are electrically connected to each other through bonding wires. For example, both the sensor chip 321 and the signal processing chip 322 are formed on a common silicon substrate. The housing body 323 is made of ceramic, resin, or the like. The housing body 323 and the lid 324 form a space therein, and the sensor chip 321 and the signal processing chip 322 are housed in the space.

The signal processing chip 322 is bonded to an inner surface of the housing body 323 with an adhesive (not shown). The adhesive for bonding the signal processing chip 322 and the housing body 323 is, for example, a flexible or soft adhesive having a low elastic modulus so as to reduce a thermal stress to the signal processing chip 322.

Further, the sensor chip 321 and the signal processing chip 322 are electrically connected to each other through electrically conductive members 329. Also, the sensor chip 321 and the signal processing chip 322 are bonded to each other with an adhesive sheet (not shown). The adhesive for bonding the signal processing chip 322 and the housing body 323 and the adhesive sheet for bonding the sensor chip 321 and the signal processing chip 322 may be made of the same type of adhesive or different types of adhesive. The signal processing chip 322 and the sensor chip 321 are mounted on the housing body 323 in due order. In FIG. 2, a lower surface of the signal processing chip 322 provides a sensor surface to which the sensor chip 321 is positioned. The signal processing chip 322 is connected to bonding wires 330 for extracting signals.

The inner unit 311 is housed in the casing 312, as shown in FIG. 1B. The casing 312 is, for example, made of resin. The casing 312, for example, has a tubular shape with corners. The lead frames 313 are insert-molded in the casing 312.

The inner unit 311 has end walls 325, 326 at ends with respect to a thickness direction in which the thickness of the inner unit 311 is measured, that is, in a direction along the Z axis. The end wall 325 is included in the housing body 323. The end wall 326 is included in the lid 324. A cover 314 closes an opening of a casing body 331 of the casing 312 on a side adjacent to the end wall 325 of the inner unit 311. A cover 317 closes an opposite opening of the casing body 331 on a side adjacent to the end wall 326 of the inner unit 311.

The inner unit 311 has pads 327 on the surface of the end wall 325. The pads 327 are electrically connected to the sensor chip 321 and the signal processing chip 322 through the bonding wires 330. The casing 312 has pads 328 electrically connected to the lead frames 313 as electrically conductive portions. The pads 328 are formed on surfaces of the casing body 331. Each bonding wire 316 connects the pad 327 of the inner unit 311 and the pad 328 of the casing body 331. Thus, the inner unit 311 and the lead frame 313 are electrically connected to each other through the bonding wire 316.

Figure 4A:
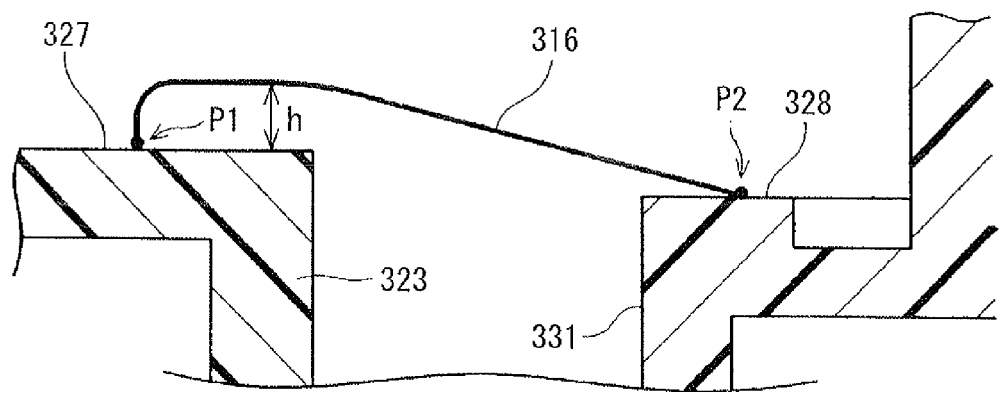
FIG. 4A is an enlarged cross-sectional view of a section IV shown in FIG. 1B.

As shown in FIG. 4A, a first end of the bonding wire 316 is connected to the pad 327 of the housing body 323, and a second end of the bonding wire 316 is connected to the pad 328 of the casing body 331. Hereinafter, a connecting portion between the first end of the bonding wire 316 and the pad 327 is referred to as a first bonding portion P1, and a connecting portion between the second end of the bonding wire 316 and the pad 328 is referred to as a second bonding portion P2.

The bonding wire 316 is connected to the pads 327, 328 by a ball bonding technique, for example. The bonding wire 316 may be connected to the pads 327, 328 by any other techniques, such as a wedge bonding technique.

The bonding wire 316 is a wire made of an alloy or a metal, such as gold or copper, and has electrical conductivity. The bonding wire 316 electrically connects between the first bonding portion P1 and the second bonding portion P2, that is, between the pad 327 and the pad 328, while curving opposite to a support surface 333 of the casing 312.

As shown in FIGS. 1B and 4A, for example, the bonding wire 316 extends upwardly from the first bonding portion P1. The bonding wire 316 then bends and extends substantially parallel to the support surface 333 toward the pad 328. Further, the bonding wire 316 sloped downwardly and connects to the pad 328.

That is, the bonding wire 316 extends substantially perpendicular to the surface of the end wall 325 on which the pad 327 is formed from the pad 327, and bends to extend substantially parallel to the surface of the end wall 325. Then, the bonding wire 316 connects to the pad 328 while slightly inclining relative to the surface of the end wall 325.

In FIG. 4A, "h" denotes a dimension (height) between the pad 327 and the highest point of the bend of the bonding wire 316. The highest point corresponds to the furthest point of the bonding wire 316 from the surface of the end wall 325 on which the pad 327 is formed.

Figure 4B:
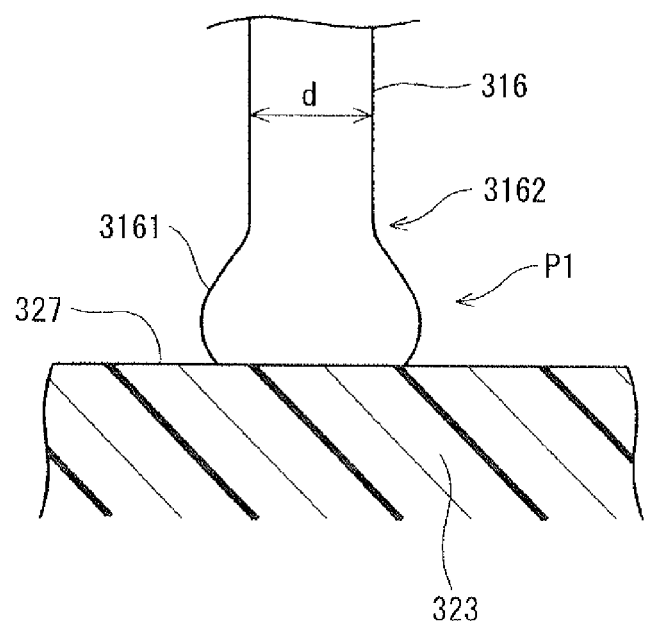
FIG. 4B is an enlarged view around a first bonding portion of a bonding wire of the physical quantity sensor according to the embodiment.

As shown in FIG. 4B, the first end of the bonding wire 316 has a ball portion 3161. The ball portion 3161 is formed by melting the bonding wire 316 by the ball bonding technique. The bonding wire 316 is connected to the pad 327 through the ball portion 3161. The bonding wire 316 includes a neck portion 3162 at a boundary between the ball portion 3161 and other portion thereof. For example, the bonding wire 316 is formed into a wire having a diameter d of approximately 0.03 mm. Considering a machining or processing error of the bonding wire 316, the diameter d is, for example, in a range of 0.020 to 0.040 mm including 0.030 mm.

As shown in FIG. 1B, the casing 312 has the casing body 331 and support portions 332. The casing body 331 has a generally tubular shape with corners.

The casing body 331 surrounds an outer periphery of the inner unit 311. The support portions 332 project from an inner surface of the casing body 331 and have the support surfaces 333 opposed to the end wall 326 of the inner unit 311.

Figure 5:
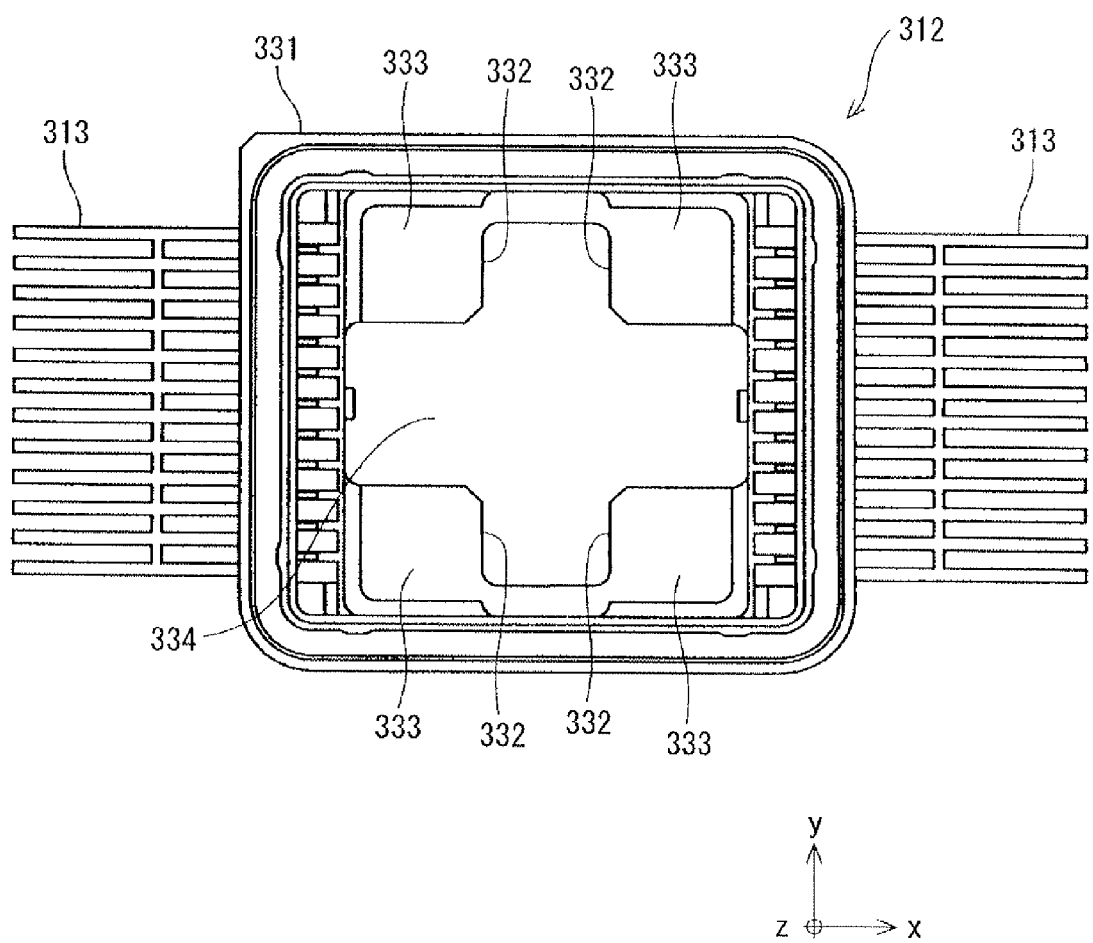
FIG. 5 is a schematic plan view of a casing of the physical quantity sensor according to the first embodiment.

As shown in FIG. 5, the support portion 332 project inwardly from the corners of the casing body 331. An opening 334 having a substantially cross shape is formed between the casing body 331 and the support portions 332. The opening 334 is formed as a through hole penetrating in a direction along the Z axis.

The vibration isolating member 315 is located between the end wall 326 of the inner unit 311 and the support surfaces 333 of the casing 312, as shown in FIG. 1B. The vibration isolating member 315 joins the inner unit 311 and the casing 312 to each other. That is, the vibration isolating member 315 bonds the inner unit 311 and the casing 312. Therefore, the inner unit 311 is held on the support portions 332 by the vibration isolating member 315. The vibration isolating member 315 is made of soft elastomer, such as silicone rubber, room temperature vulcanization (RTV) silicone rubber or the like. For example, the vibration isolating member 315 is located at each of the four corners of the inner unit 311.

A resonance frequency of the inner unit 311 is an important factor to determine a vibration isolation characteristic in the physical quantity sensor 310. The resonance frequency of the inner unit 311 is defined by the mass of the inner unit 311 and a spring constant of the vibration isolating members 315. The spring constant of the vibration isolating members 315 depends on a distance between the inner unit 311 and the casing 312, or depends on the thickness of the vibration isolating members 315. Therefore, a vibration damping property of the vibration isolating members 315 is adjusted to a desired value by changing the spring constant of the vibration isolating members 315.

For example, when the physical quantity sensor 310 is a gyro sensor having an oscillator vibrating with a predetermined driving frequency, a vibration of the driving frequency needs to be damped in order to reduce a relative vibration between the inner unit 311 and the casing 312. For example, the driving frequency for oscillating the oscillator is approximately 10 kHz. To reduce the vibration of approximately 10 kHz, the vibration isolating members 315 need to have a resonance frequency of approximately 1 kHz.

In this case, it is preferable that the vibration isolating members 315 have a small resonance magnification because there will be a possibility of exceeding a internal processing range in the signal processing chip 322 depending on the resonance magnification of the vibration isolating members 315. In the embodiment, since the vibration isolating members 315 are made of elastomer having viscosity and elasticity, the vibration isolating members 315 can have a high loss coefficient, as compared with a resin support member or a metallic spring member. Therefore, the vibration isolating members 315 can have a small resonance frequency.

The inner unit 311 is supported at four positions by the vibration isolating members 315. Therefore, in a case where a vibration externally acts on the physical quantity sensor 310, the vibration isolating members 315 receive a load in a shearing direction, such as directions along the plane, such as in directions along the X axis and Y axis. In this case, the vibration isolating members 315 reduce the vibration in the shearing direction, with respect to the directions along the X axis and Y axis. Further, the vibration isolating members 315 receives a load in stretching and compressing directions, such as in directions along the Z axis. In this case, the vibration isolating members 315 reduce the vibration in the stretching and compressing directions, with respect to the direction along the Z axis.

That is, the inner unit 311 supported by the vibration isolating members 315 is moved in the directions along the X axis, the Y axis and the Z axis, relative to the casing 312. In this case, the bonding wire 316 receives a displacement force in three-dimensional. If the bonding wire 316 is deformed, a stress due to the deformation is apt to concentrate particularly at the neck portion 3162. As a result, the neck portion 3162 is likely to be damaged, such as broken.

Figure 6:
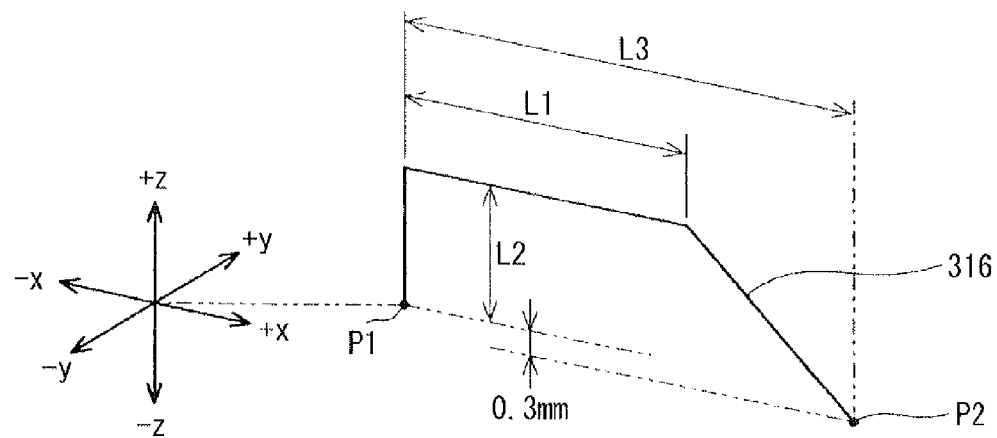
FIG. 6 is an explanatory view of the bonding wire according to the first embodiment.

FIG. 6 shows a schematic view of the bonding wire 316. The bonding wire 316 has a loop shape, like a trapezoid, between the first bonding portion P1 and the second bonding portion P2. Hereinafter, the length of a portion corresponding to the upper base of the trapezoid is referred to as a loop upper width L1. The height of the trapezoid, that is, a dimension corresponding to the aforementioned height h is referred to as a loop height L2. The horizontal distance from the first bonding portion P1 to the second bonding portion P2 is referred to as a loop overall width L3.

Of the directions along the X axis, the direction from the first bonding portion P1 toward the second bonding portion P2 is referred to as a +X direction, and the direction from the second bonding portion P2 to the first bonding portion P1 is referred to as a −X direction. Likewise, of the directions along the Z axis, the direction from the first bonding portion P1 toward the highest point of the curve of the bonding wire 316 is referred to as the +Z direction, and the direction from the highest point of the curve of the bonding wire 316 toward the first bonding portion P1 is referred to as a −Z direction. With regard to the directions along the Y axis, one direction is referred to as a +Y direction, and the opposite direction is referred to as a −Y direction.

Figure 7:
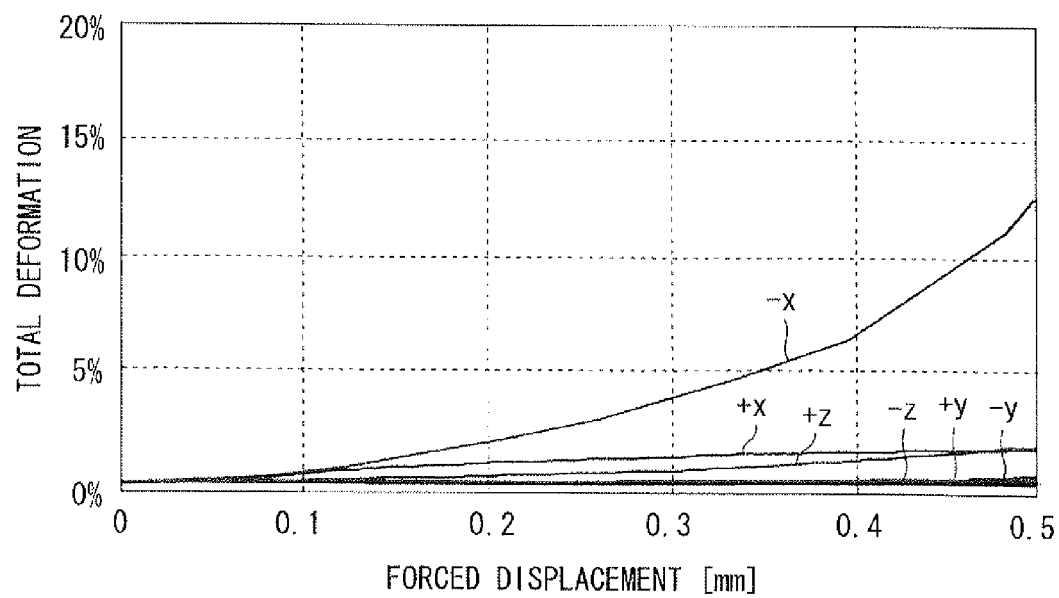
FIG. 7 is a graph showing a relationship between the amount of forced displacement and deformation of a bonding wire having a conventional structure.

FIG. 7 shows a relationship between a forced displacement and a deformation of a bonding wire having a conventional structure, where the inner unit 311 is displaced in the +X, −X, +Y, −Y, +Z and −Z directions relative to the casing body 331, that is the inner unit 311 is forcibly displaced in those directions. As shown in FIG. 7, in the bonding wire having the conventional structure, the deformation due to the displacement in the −X direction is greater than deformations due to displacements in the other directions. Therefore, the deformation of the bonding wire 316 due to the displacement of the inner unit 311 relative to the casing body 331 can be effectively reduced by reducing the deformation with respect to the −X direction.

To effectively reduce the deformation of the bonding wire 316, various simulations were conducted for analyzing the shape of the bonding wire 316, and a desirable shape capable of reducing the deformation with respect to the −X direction was found. Hereinafter, the simulations will be described.

As shown in FIG. 8A, in the simulation, the loop upper length L1, the loop height L2 and the loop overall width L3 are respectively set to three levels as control factors. Specifically, the control factors are set to the following values, respectively.

Loop upper length L1: 0 mm, 1.0 mm, 2.0 mm
Loop height L2: 0.4 mm, 0.6 mm, 0.8 mm
Loop overall width L3: 2.6 mm, 3.2 mm, 3.8 mm Further, as shown in FIG. 8B, the loop overall width L3 has variations at two levels, such as −0.1 mm and +0.1 mm, as an error factor N. In the simulation, the outer diameter d of the bonding wire is 0.03 mm, as described in the above. However, due to the machining or processing error, the outer diameter d of the bonding wire 316 is in the range of $0.020\ mm \leq d \leq 0.040$ mm.

Since the three control factors each have the three levels and the error factor N has the two levels, there are fifty-four variations in total (i.e., 3×3×3×2=54). In such a case, the simulation can be conducted with saved labor using a well-known orthogonal array. In the embodiment, L9 orthogonal array as shown in FIG. 9 is employed.

Figure 10:
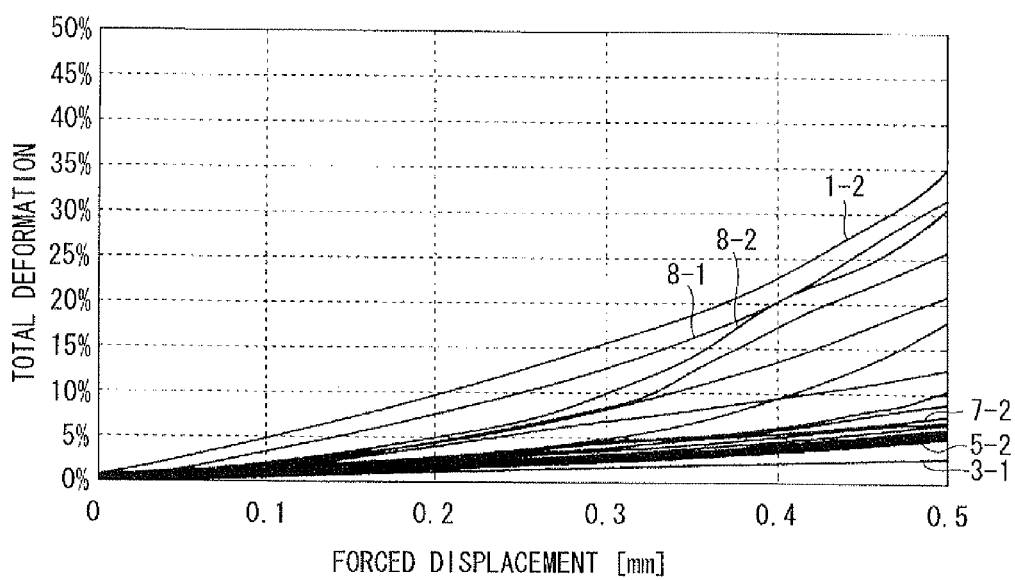
FIG. 10 is a graph showing a relationship between the amount of forced displacement and a total deformation as a simulation result according to the first embodiment.
Figure 11A:
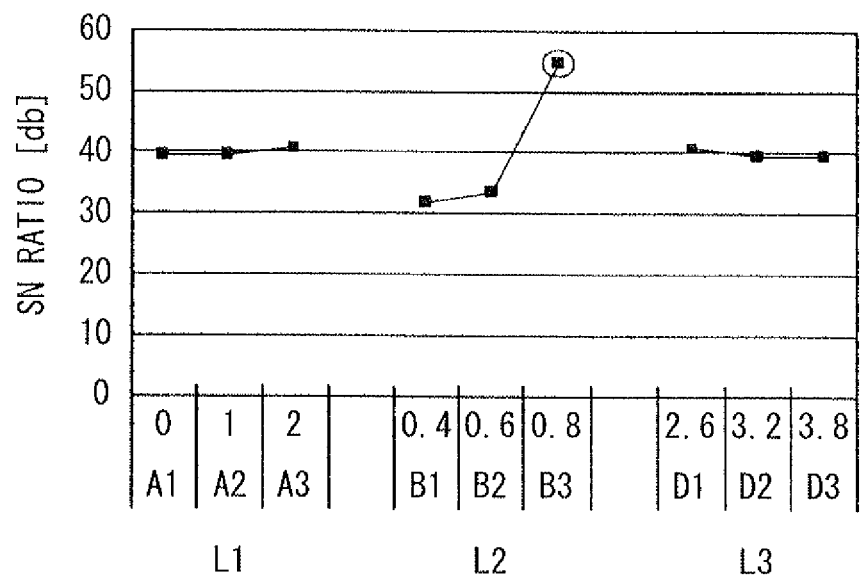
FIG. 11A is a graph showing an analysis result with regard to an SN ratio based on the simulation result according to the first embodiment.
Figure 11B:
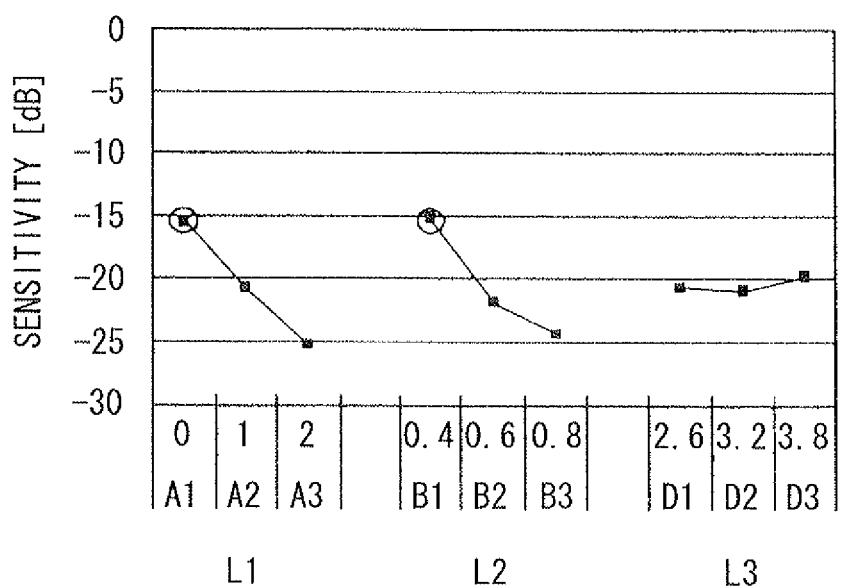
FIG. 11B is a graph showing an analysis result with regard to sensitivity based on the simulation result according to the first embodiment.
Figure 12:
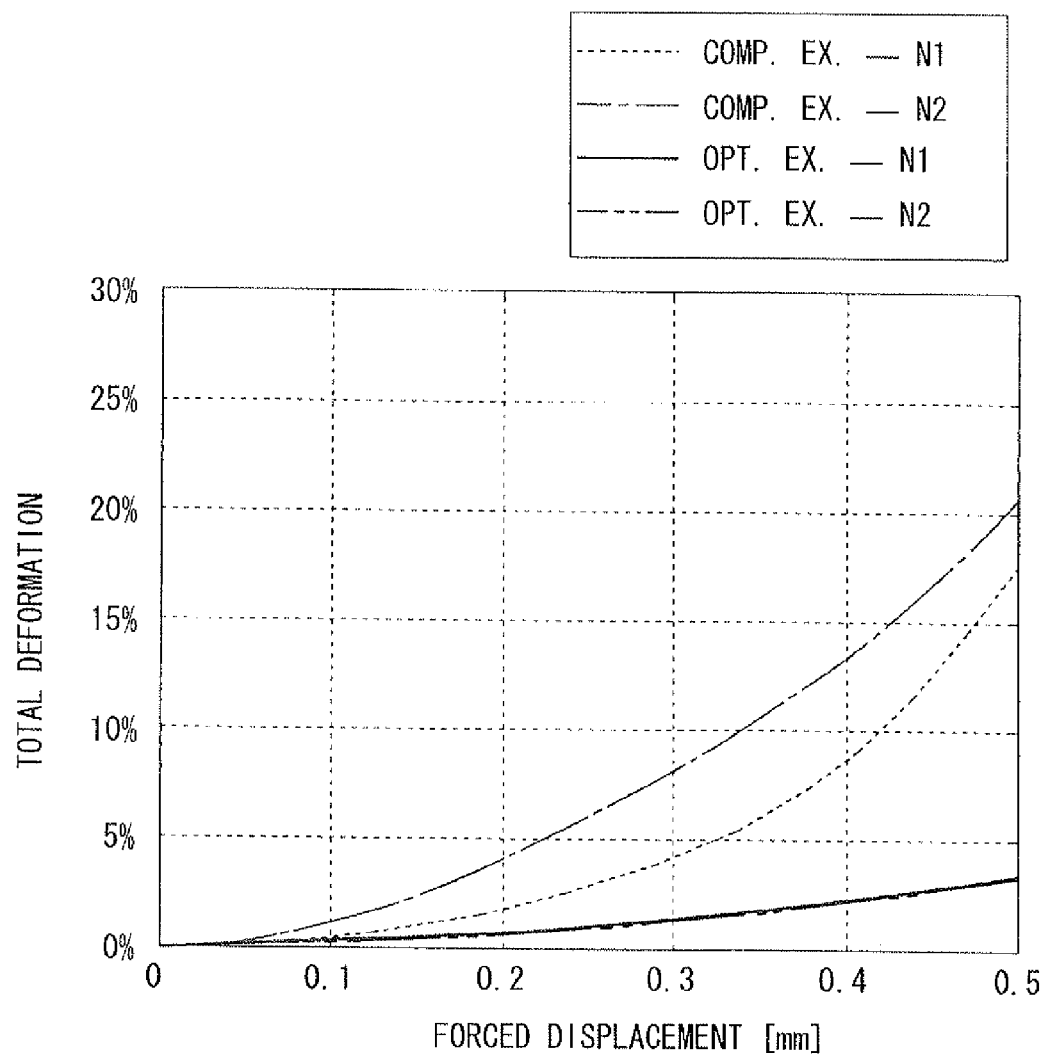
FIG. 12 is a graph showing a relationship between the amount of forced displacement and total deformation as a simulation result according to the first embodiment.

FIGS. 10 to 12 show results of the simulations conducted in the aforementioned conditions. FIG. 10 shows a relationship between the forced displacement and the total deformation of the bonding wire 316. In FIG. 10, some of representative simulation results are denoted by "level-error factor". For example, "1-2" denotes a simulation result where the error factor N (FIG. 8B) is "level 2" in a control factor combination of "No=1" in FIG. 9. According to FIG. 10, while the total deformation increases with an increase in the amount of forced displacement, the tendency is inconsistent.

FIGS. 11A and 11B show analysis results of effects given by the control factors L1 to L3 based on the simulation result shown in FIG. 10. FIG. 11A shows the analysis result with regard to an SN ratio. FIG. 11B shows the analysis result with regard to sensitivity. Because the SN ratio and the sensitivities are well-known item generally used in quality engineering, detailed descriptions thereof are omitted.

The analysis result of FIG. 11A indicates that, of the loop upper width L1, the loop height L2, and the loop overall width L3, an increase in the loop upper width L1 is effective to improve the SN ratio. The analysis result of FIG. 11B indicates that increases in the loop upper length L1 and the loop height L2 are effective to improve the sensitivity.

The analysis results shown in FIGS. 10, 11A, 11B indicate that the increase in the loop height L2 is effective to reduce deformation of the bonding wire 316. In such a case, for example, a lower limit of the loop height L2 is 0.6 mm, because if the loop height L2 is below 0.6 mm, the improvement of the SN ratio and the sensitivity are not expected enough and the SN ratio and the sensitivity remarkably reduces, as shown in FIGS. 11A and 11B.

Further, if the target value of the loop height L2 is 0.6 mm, the actual loop height L2 may be lower than 0.6 mm due to the machining or processing error in forming of the bonding wire 316. In view of this matter, the loop height L2 is optimally set to 0.8 mm, for example.

FIG. 12 shows a relationship between the amount of forced displacement of the inner unit 311 and the total deformation of the bonding wire 316. In FIG. 12, a short dashed line (COMP. EX. —N1) and an alternate long and short dashed line (COMP. EX. —N2) show the total deformation of the bonding wire having a conventional structure as comparative examples, respectively. Further, a solid line (OPT. EX. —N1) and an alternate long and two short dashed line (OPT. EX. —N2) show the total deformation of the bonding wire 316 in the optimal condition as optimal examples. As shown in FIG. 12, the deformation of the bonding wire 316 is reduced by optimizing the loop height L2.

In addition to the lower limit, an upper limit is given to the loop height L2 of the bonding wire 316 in view of machining or characteristic. The upper limit in view of the machining is determined by such as the size of the casing 312 and a positional relations with the inner unit 311 and the cover 314 (e.g., FIG. 1B). The upper limit in view of the characteristic is determined to reduce an effect to output sensitivity of the physical quantity sensor 310.

Figure 13A:
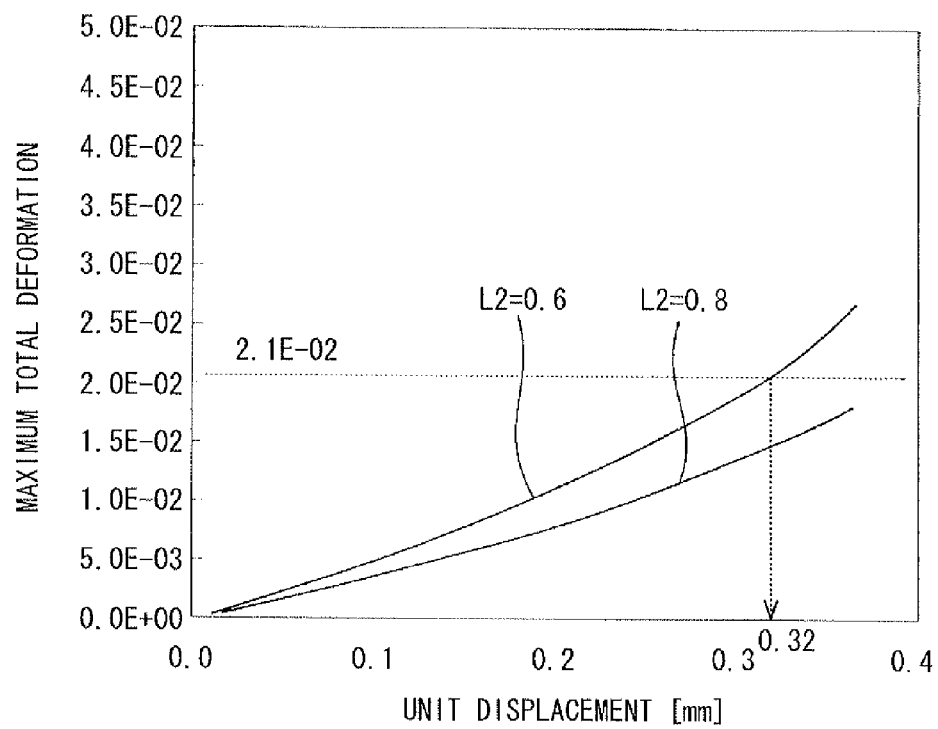
FIG. 13A is a graph showing a relationship between the amount of unit displacement and maximum total deformation according to the first embodiment.

FIG. 13A shows a relationship between the amount of displacement of the inner unit 311 and maximum total deformation of the bonding wire 316 in a case where an impact is externally applied at the resonance frequency of the vibration isolating members 315. The maximum total deformation corresponds to a fracture limit of the bonding wire 316. The maximum total deformation allowed for the bonding wire 316 having the aforementioned structure is approximately $2.1e^{-2}$ mm (0.021 mm).

Figure 13B:
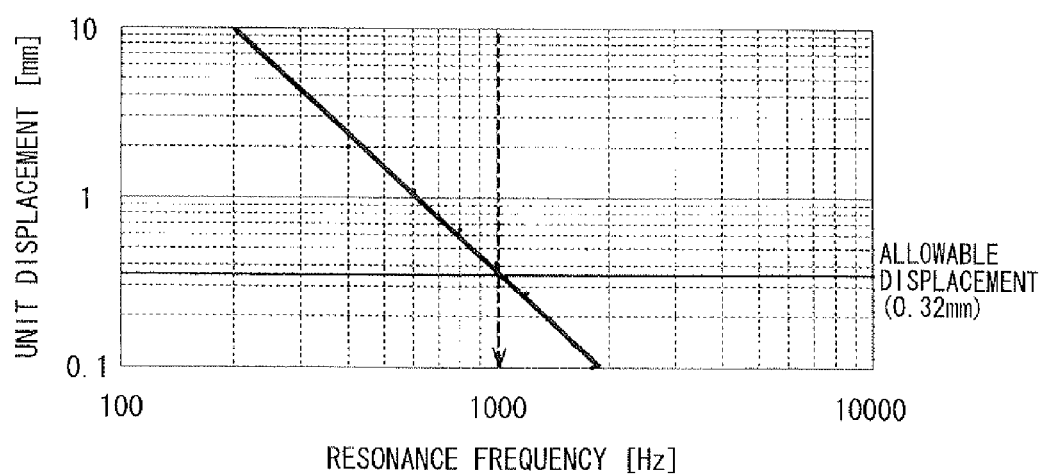
FIG. 13B is a graph showing a relationship between a resonance frequency and the amount of unit displacement for explaining the allowable displacement according to the first embodiment.

Therefore, in a case where the loop height L2 is set to equal to or higher than 0.6 mm, an allowable displacement amount is approximately 0.32 mm. In other words, the resonance frequency of the vibration isolating members 315 needs to be set in a range where the amount of displacement of the inner unit 311 is equal to or less than approximately 0.32 mm. Therefore, the resonance frequency of the vibration isolating members 315 is set to a level equal to or higher than approximately 1000 Hz, based on a relationship between the resonance frequency and the amount of displacement of the inner unit 311 shown in FIG. 13B.

Considering a manufacturing error of the sensor chip 321, the vibration isolating members 315 need the damping property of equal to or higher than −30 dB. To set the resonance frequency of the vibration isolating members 315 equal to or higher than approximately 1000 Hz, it is necessary to set the driving frequency of the sensor chip 321 to equal to or higher than approximately 6 kHz. However, if the driving frequency of the sensor chip 321 increases, a driving speed of the sensor chip 321 reduces. As a result, the Coriolis force of the sensor chip 321 reduces, affecting the output sensitivity. Therefore, an upper limit of the driving frequency of the sensor chip 321 is approximately 15 kHz, for example. In this case, the resonance frequency of the vibration isolating members 315 is approximately 2.5 kHz.

The inner unit 311 is supported by the vibration isolating members 315 at the lower portion thereof. Also, the inner unit 311 is connected to the bonding wires 316 at the upper portion thereof. In such a structure, if a relationship between a vibration property of the bonding wires 316 and a vibration property of the vibration isolating member 315 is not suitable, it may be difficult to achieve desirable damping characteristic. In order to reduce an effect to the vibration damping property of the vibration isolating members 315, it is necessary to set the resonance frequency of the bonding wires 316 to a range without overlapping the resonance frequency of the vibration isolating member 315.

Figure 14:
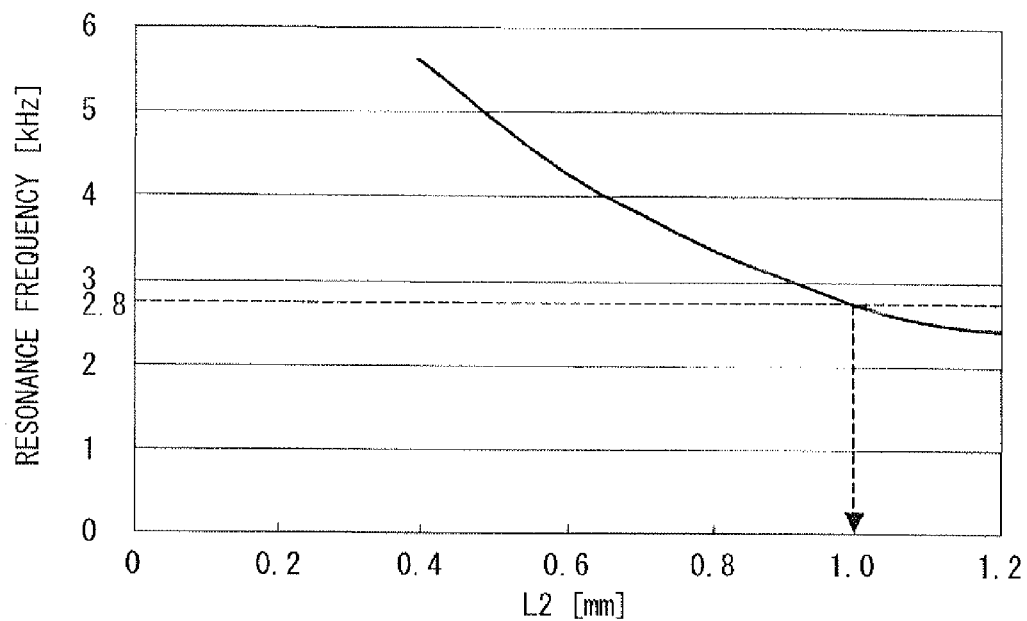
FIG. 14 is a graph showing a relationship between a loop height and a resonance frequency according to the first embodiment.

FIG. 14 shows a relationship between the loop height L2 and the resonance frequency of the bonding wire 316. According to FIG. 14, if the lower limit of the resonance frequency of the bonding wires 316 is higher than the upper limit of the resonance frequency of the vibration isolating members 315, the resonance frequency of the bonding wires 316 does not overlap the resonance frequency of the vibration isolating members 315. That is, the lower limit of the resonance frequency of the bonding wires 316 is set at least higher than the upper limit of the resonance frequency of the vibration isolating members 315. In the embodiment, for example, the lower limit of the resonance frequency of the bonding wire 316 is set to approximately 2.8 kHz by adding approximately 0.3 kHz as a margin to the upper limit (approximately 2.5 kHz) of the resonance frequency of the vibration isolating members 315. In this case, as shown in FIG. 14, an upper limit of the loop height L2 is approximately 1.0 mm. The upper limit of the loop height L2 corresponds to an upper limit in view of the property. If the upper limit in view of machining is equal to or less than 1.0 mm, the upper limit of the loop height L2 is determined by the upper limit in view of machining.

In this way, by setting the loop height L2 to equal to or higher than 0.6 mm, the deformation of the bonding wire 316 can be reduced less than the fracture deformation (maximum total deformation). Further, by setting the bop height L2 to equal to or less than 1.0 mm, it is less likely that the vibration damping property of the vibration isolating members 315 will be affected.

Accordingly, in the case where the driving frequency of the sensor chip 321 is set in the range of approximately 6 to 15 kHz, the vibration isolating members 315 can reduce the vibration of the inner unit 311 when the resonance frequency of the vibration isolating member 315 is in the range where the resonance frequency is approximately 1 to 2.5 kHz.

Figure 15:
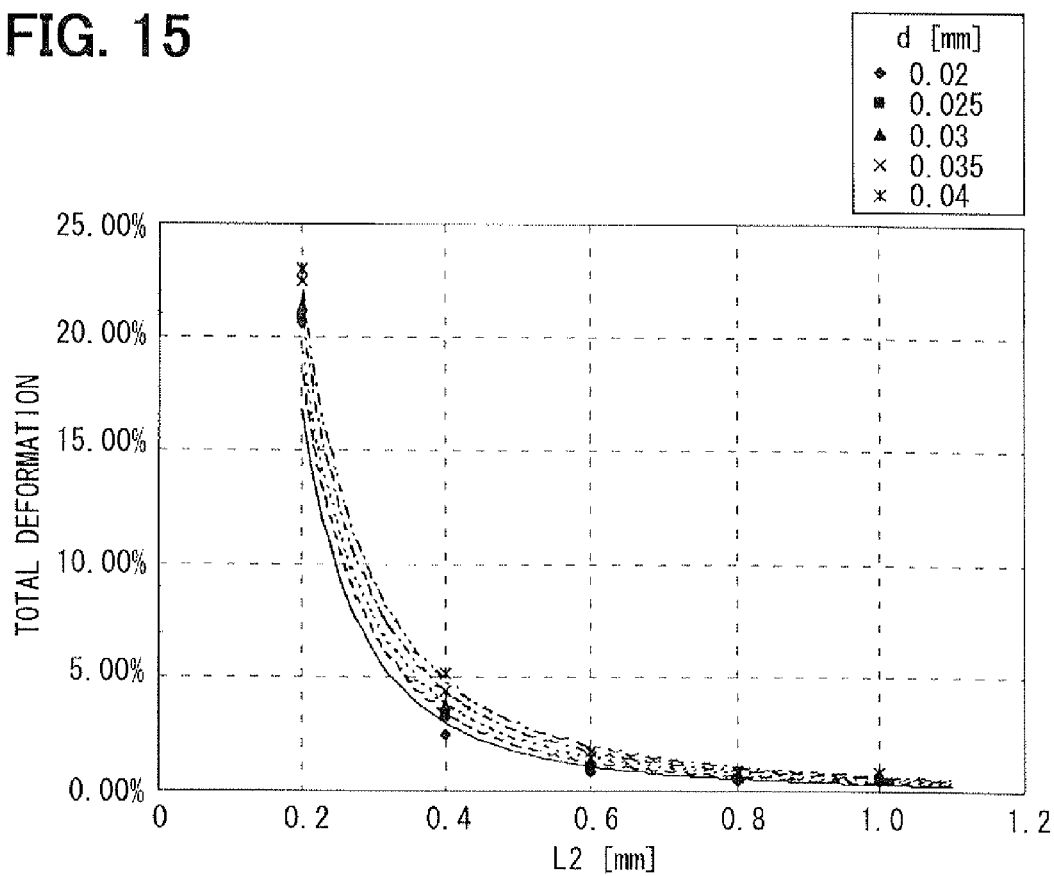
FIG. 15 is a graph showing a relationship between a loop height and total deformation according to the first embodiment.

The aforementioned upper limit and the aforementioned lower limit of the loop height L2 are determined when the outer diameter d of the bonding wire 316 is 0.3 mm. FIG. 15 shows a relationship between the loop height L2 and the total deformation, with regard to the bonding wires 316 having different outer diameters d. The loop height L2 is set to 0.02 mm, 0.025 mm, 0.03 mm, 0.035 mm, and 0.04 mm. According to FIG. 15, when the outer diameter d of the bonding wire 316 is in a range from 0.020 mm and 0.040 mm (0.020 mm≤d≤0.040 mm), the total deformation of the bonding wire 316 is effectively reduced by optimizing the loop height L2.

Figure 16:
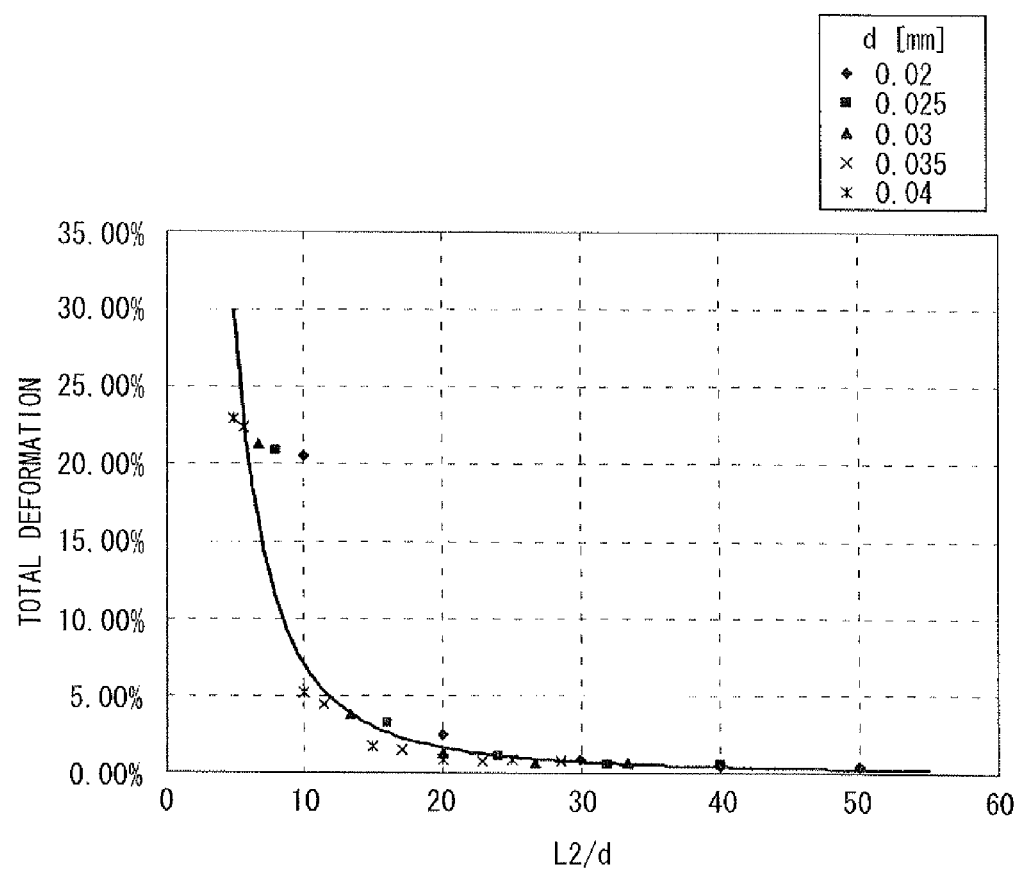
FIG. 16 is a graph showing a relationship between a ratio of a loop height to an outer diameter and total deformation according to the first embodiment.

FIG. 16 shows a relationship between the loop height L2 and the total deformation of the bonding wire 316, in which the loop height L2 is regulated by the outer diameter d of the bonding wire 316. As shown in FIG. 16, the total deformation largely changes where the ratio of the loop height L2 to the outer diameter d is about 15. Further, the total deformation becomes substantially linear, that is, does not largely change in a range where the ratio of the loop height L2 to the outer diameter d is over 20. That is, even if the outer diameter d of the bonding wire 316 changes, the deformation of the bonding wire 316 is effectively reduced by setting the outer diameter d and the loop height L2 ($h$) to satisfy the relationship of $20 \times d \leq h$.

The aforementioned physical quantity sensor 310 provides the following effects. The vibration isolating members 315 are disposed between the inner unit 311 and the casing 312. Thus, the vibration isolating members 315 restrict the vibrations of the casing 312 from being transmitted to the inner unit 311. The vibration isolating members 315 are flexible. Therefore, the vibration isolating members 315 absorb the relative vibration between the inner unit 311 and the casing 312 while joining the inner unit 311 and the casing 312 to each other. The vibration isolating members 315 are disposed between the end wall 326 of the inner unit 311 and the support surfaces 333 of the casing 312. With this, the inner unit 311 does not directly contact the casing 312. The vibration isolating members 315 are flexible members made of soft resin, such as elastomer. Thus, the vibration isolating members 315 absorb the relative vibration between the inner unit 311 and the casing 312 while joining the inner unit 311 and the casing 312.

The strength and the spring constant of the vibration isolating members 315 can be easily adjusted by changing the property of the vibration isolating members 315, such as a thickness and a foaming amount. Therefore, the vibration damping structure is achieved by the vibration isolating members 315, whose spring constant is easily adjusted. The vibration damping structure is achieved without reducing the strength and without requiring high accuracy for processing.

The strength and the spring constant of the vibration isolating members 315 are easily adjusted by varying the thickness and/or the width of the vibration isolating members 315. Therefore, the vibration damping structure for damping the relative vibration between the inner unit 311 and the casing 312 is achieved without reducing the strength and without requiring high accuracy in forming, and the spring constant of the vibration isolating members 315 can be easily adjusted. The lid 324 of the inner unit 311 is not in direct contact with the support portions 333. That is, the lid 324 of the inner unit 311 is connected to the support portions 333 through the vibration isolating members 315. Therefore, the vibration from the support portions 333 is not directly transmitted to the inner unit 311. The vibration from the support portions 333 is transmitted to the inner unit 311 through the vibration isolating members 315. Accordingly, the inner unit 311 is effectively restricted from the vibration, as compared with the structure in which an inner unit is directly in contact with support portions of a casing.

The bonding wire 316 electrically connects the lead frame 313 and the pad 327. The bonding wire 316 extends from the pad 327 to the pad 328 while curving opposite to the support portions 333. The bonding wire 316 includes the bend. The bonding wire 316 is configured such that its outer diameter d and the loop height L2 ($h$) from the pad 327 satisfy the relation of $20 \times d \leq h$.

Therefore, even if the inner unit 311 is displaced relative to the casing body 331, the deformation of the bonding wire 316 can be reduced. That is, even if the impact is externally applied to the casing 312, the deformation of the bonding wire 316 is restricted within the fracture deformation. Therefore, the damage to the bonding wire 316, particularly damage to the neck portion 3162 is reduced, and hence the strength and durability of the physical quantity sensor 310 improve. Even if the physical quantity sensor 310 is mounted on a vehicle, the bonding wires 316 will not be affected by an excess impact. The reliability of electrical connections in the physical quantity sensor 310 improves.

The loop height L2 of the bonding wire 316 is equal to or lower than 1.0 mm. Therefore, the resonance frequency of the bonding wires 316 does not overlap the resonance frequency of the vibration isolating members 315. As such, the resonance of the bonding wires 316 will not affect the vibration isolation performance of the vibration isolating members 315. Accordingly, the vibration isolation performance is ensured while maintaining the strength and the durability of the bonding wires 316.

In the case where the outer diameter d of the bonding wire 316 is in the range of 0.020 mm to 0.040 mm ($0.020 \leq d \leq 0.040$), the loop height L2 ($h$) is set to satisfy the relation of $20 \times d \leq h$. Thus, the strength and the durability of the physical quantity sensor 310 improve.

(Second Embodiment)

Figure 17A:
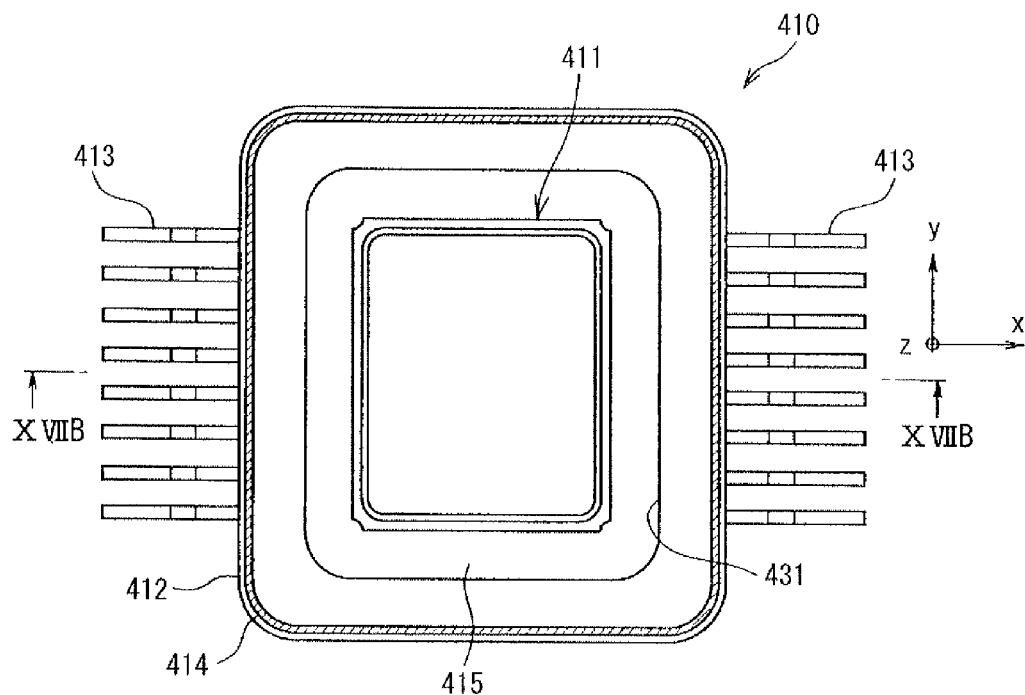
FIG. 17A is a schematic plan view of a physical quantity sensor, partially including a cross-section, according to a second embodiment of the present invention.
Figure 17B:
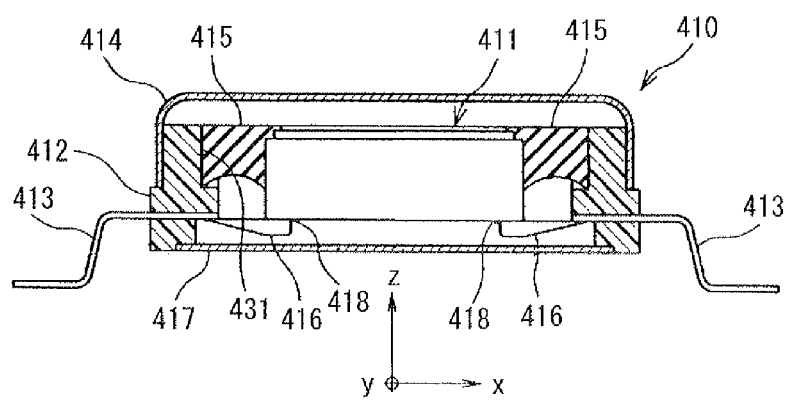
FIG. 17B is a schematic cross-sectional view taken along a line XIIB-XIIB in FIG. 17A.

FIGS. 17A and 17B shows a physical quantity sensor 410 according to a second embodiment. As shown in FIG. 17A, the physical quantity sensor 410 includes an inner unit 411 as a sensing portion, a casing 412, lead frames 413, a cover 414, a vibration isolating member 415, bonding wires 416 and a cover 417.

Figure 18:
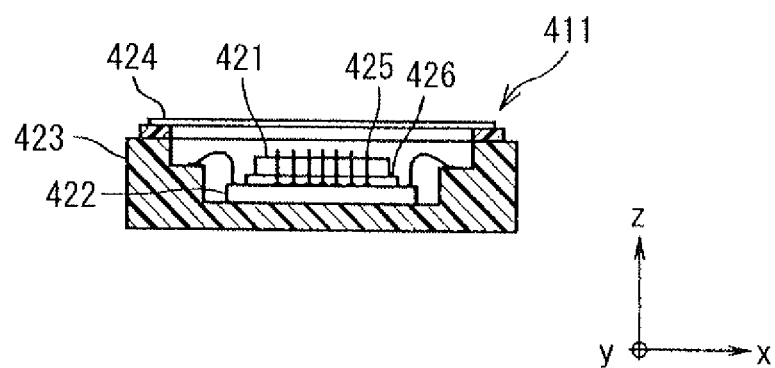
FIG. 18 is a schematic cross-sectional view of an inner unit of the physical quantity sensor according to the second embodiment.

As shown in FIG. 18, the inner unit 411 has a sensor chip 421, a signal processing chip 422, a package 423 and a lid 424. The sensor chip 421 has a substantially same structure as the sensor chip 321 shown in FIG. 3.

The signal processing chip 422 performs signal processing on a capacitance or voltage change detected by the sensor chip 421, and adjusts a voltage applied to the sensor chip 421. The sensor chip 421 and the signal processing chip 422 are, for example, formed on silicon or ceramic substrates. As an detection object, for example, the sensor chip 421 detects an angular velocity or acceleration in directions along the X axis and/or the Y axis. The signal processing chip 422 may have arbitrary functions in accordance with a use of the physical quantity sensor 410.

The sensor chip 421 and the signal processing chip 422 are electrically connected to each other through bonding wires 425. For example, the sensor chip 421 and the signal processing chip 422 may be formed on a common silicon substrate. The package 423 is made of ceramic, resin or the like. The package 423 and the lid 424 form a space therebetween. The sensor chip 421 and the signal processing chip 422 are housed in the space.

The signal processing chip 422 is bonded to the package 423 with an adhesive (not shown). The adhesive for bonding the signal processing chip 422 and the package 423 is flexible or soft adhesive having a low elastic modulus so as to reduce a thermal stress applied to the signal processing chip 422.

The sensor chip 421 is bonded to the signal processing chip 422 with an adhesive sheet 426. The adhesive for bonding the signal processing chip 422 and the package 423 and the adhesive sheet 426 may be made of the same material, or different materials. The signal processing chip 422 and the sensor chip 421 are mounted on the package 423 in due order. In FIG. 18, an upper surface of the signal processing chip 422 provides a sensor surface on which the sensor chip 421 is positioned.

The inner unit 411 is housed in the casing 412, as shown in FIG. 17. The casing 412 is, for example, made of resin. The casing 412, for example, has a tubular shape with corners. The casing 412 has an opening 431, which is larger than the inner unit 411. The lead frames 413 are insert-molded with the casing 412. The inner unit 411 is electrically connected to the lead frames 413 through the bonding wires 416.

A first end of the bonding wire 416 is connected to a pad 418 formed on a lower surface of the package 423, and a second end of the bonding wire 416 is connected to the lead frame 413. Although the bonding wire 416 is curved in an opposite direction to the bonding wire 316 of the first embodiment shown in FIG. 4, that is, the bonding wire 416 is upside down relative to the bonding wire 316 of the first embodiment, the bonding wire 416 has the substantially same structure as the bonding wire 316.

The bonding wire 416 is connected by a well-known techniques, such as a ball bonding technique or a wedge bonding, similar to the first embodiment. The pad 418 is formed on the lower surface of the inner unit 411. The bonding wire 416 extends downwardly from the pad 418 and bends to extend substantially parallel to the lower surface of the inner unit 411. Further, the bonding wire 416 extends slightly upward to connect to the lead frame 413. In other words, the bonding wire 416 extends substantially perpendicular to the pad 418, that is, in a direction along the Z axis, and then bends toward the lead frame 413. In this case, similar to the first embodiment, the distance between the pad 418 to the lowest point of the bend of the bonding wire 416, that is, to the furthest point of the bonding wire 416 from the pad 48 in the direction perpendicular to the surface of the inner unit 411 corresponds to the height h and the loop height L2. Similar to the first embodiment, the bonding wire 416 has the outer diameter d of approximately 0.03 mm. Also, the bonding wire 416 is configured to satisfy the relation of 20×d≤h. The bonding wire 416 has the loop height L2 in a range of 0.6 to 1.0 mm. The cover 414 covers an upper surface of the inner unit 411. That is, the cover 414 covers the inner unit 411 on a side adjacent to the sensor chip 421. The cover 417 covers a lower surface of the inner unit 411. That is, the cover 417 covers the inner unit 411 on a side adjacent to the package 23, that is, on a side opposite to the sensor surface.

The opening 431 of the casing 412 is greater than the inner unit 411. Therefore, a clearance is provided between the inner unit 411 and the casing 412. The vibration isolating member 415 is disposed in the clearance, that is, between the inner unit 411 and the casing 412. The vibration isolating member 415 is made of flexible elastomer, such as silicone rubber, silicone RTV rubber, or the like.

A resonance frequency of the inner unit 411 is an important factor to determine a vibration isolation characteristic in the physical quantity sensor 410. The resonance frequency of the inner unit 411 is adjusted by the mass of the inner unit 411 and a spring constant of the vibration isolating member 415. The spring constant of the vibration isolating member 415 depends on a distance between the inner unit 411 and the casing 412, or depends on the thickness of the vibration isolating member 415. Therefore, a vibration damping property of the vibration isolating member 415 is adjusted to a desired value by changing the spring constant of the vibration isolating member 415.

For example, when the physical quantity sensor 410 is a gyro sensor having an oscillator vibrating with a predetermined driving frequency, a vibration of the driving frequency needs to be damped in order to reduce a relative vibration between the inner unit 411 and the casing 412. For example, the driving frequency for oscillating the oscillator is approximately 10 kHz. To reduce the vibration of approximately 10 kHz, the vibration isolating member 415 needs to have a resonance frequency of approximately 1 kHz.

In this case, it is preferable that the vibration isolating member 415 has a small resonance magnification because there will be a possibility of exceeding an internal processing range in the signal processing chip 422 depending on the resonance magnification of the vibration isolating member 415. In the embodiment, since the vibration isolating member 415 is made of elastomer having viscosity and elasticity, the vibration isolating member 415 can have a high loss coefficient, as compared with a resin support member or a metallic spring member. Therefore, the vibration isolating member 415 can have a small resonance frequency.

The vibration isolating member 415 is disposed between the inner unit 411 and the casing 412. Thus, the vibration isolating member 415 restricts the vibration of the casing 412 from being transmitted to the inner unit 411. The vibration isolating member 415 is flexible. Therefore, the vibration isolating member 415 absorbs a relative vibration between the inner unit 411 and the casing 412 while joining the inner unit 411 and the casing 412 to each other.

The vibration isolating member 415 is disposed between the casing 412 and at least one of X axis side walls and Y axis side walls of the inner unit 411. The X axis side walls extend along the X axis and the Y axis side walls extend along the Y axis. In this case, the vibration isolating member 415 absorbs at least one of a component in the direction along the X axis and a component in the direction along the Y axis of the vibration transmitted from the casing 412 toward the sensor element 20 (see, FIG. 3). Therefore, the vibration isolating member 415 having the aforementioned structure is effective to a structure in which the movable direction of the sensor element 20 within the inner unit 411 is at least one of the direction along the X axis and the direction along the Y axis.

The strength and the spring constant of the vibration isolating member 415 are easily adjusted by changing the thickness and the width of the vibration isolating member 415. Therefore, the spring constant of the vibration isolating member 415 can be adjusted to a desired value so that the relative vibration between the inner unit 411 and the casing 412 is reduced without reducing the strength and without requiring high accuracy in forming.

In addition, the lid 424 of the inner unit 411 is not in direct contact with the cover 414. That is, the lid 424 of the inner unit 411 is separated from the cover 414. Therefore, the vibrations from the covers 414, 417 are not directly transmitted to the inner unit 411. Since the vibrations from the covers 414, 417 are transmitted to the inner unit 411 through the vibration isolating member 415, the inner unit 411 is effectively restricted from the vibrations, as compared with the structure in which the inner unit is directly in contact with the covers. In the example of FIG. 17A, the vibration isolating member 415 covers or surrounds all sides of the inner unit 411, that is, covers all the X axis side walls and the Y axis side walls of the inner unit 411. That is, the inner unit 411 is entirely surrounded by the vibration isolating member 415 in the directions along the X axis and the Y axis. In such a case, even when a thermal stress is applied to the inner unit 411 from the vibration isolating member 415, the thermal stress is equally applied through the all sides of the inner unit 411. Therefore, it is less likely that the inner unit 411 will be inclined with respect to a direction along the Z axis, that is, with respect to a plane including the X axis and the Y axis, as compared with a case where a tress is partially applied, for example, through one of the side walls.

For example, when the physical quantity sensor 410 is configured to detect an angular velocity or an acceleration, the Z axis is a detection axis. If the inner unit 411 is inclined with respect to the detection axis, it is difficult to accurately detect an angular velocity or an acceleration. Therefore, surrounding all the sides of the inner unit 411 with the vibration isolating member 415 is effective to the sensor for detecting the angular velocity and/or the acceleration. However, it is not always necessary that the vibration isolating member 415 covers or surrounds all sides of the inner unit 411.

Further, as shown in FIG. 17B, the vibration isolating member 415 does not reach the end of the package 423 where the inner unit 411 and the lead frame 413 are electrically connected through the bonding wire 416. That is, the lower end of the package 423 is not covered with the vibration isolating member 415. In the case where the bottom wall of the package 423, that is, the wall mounting the signal processing chip 422 is not covered with the vibration isolating member 415, the following effects are achieved.

Deformation of the sensor chip 421 causes a change in distance between the movable driving electrode 211b and the fixed driving electrode 211c and a change in distance between the fixed detecting electrode 212b and the movable detecting electrode 212a. These changes in the distances affect cause a reduction in detection accuracy of the physical quantity sensor 410.

In the structure shown in FIG. 17B, the thermal stress from the vibration isolating member 415 is applied to an upper portion of the outer wall of the package 423 adjacent to the opening of the package 423. Thus, the upper portion of the outer wall of the package 423 is deformed. The deformation of the upper portion of the outer wall of the package 423 is transmitted to the bottom of the package 423. Thus, the bottom of the package 423 is deformed. The deformation of the bottom of the package 423 is transmitted to the signal processing chip 422. Thus, the signal processing chip 422 is deformed. The deformation of the signal processing chip 422 is transmitted to the adhesive sheet 426. Thus, the adhesive sheet 426 is deformed. The deformation of the adhesive sheet 426 is transmitted to the sensor chip 421. In this way, according to the structure shown in FIG. 17B, the thermal stress of the vibration insulating member 415 is indirectly transmitted to the sensor chip 421. The structure shown in FIG. 17B reduces the deformation of the sensor chip 421 due to the thermal stress from the vibration isolating member 415. In contrast, if the bottom of the package 423 is covered with the vibration isolating member 415, the thermal stress of the vibration isolating member 415 is directly transmitted to the sensor chip 421. Ad a result, the sensor chip 421 is largely deformed.

The bonding wire 416 electrically connects between the lead frame 413 and the pad 418. The bonding wire 416 extends from the pad 418 downwardly, bends to be substantially parallel to the bottom surface of the inner unit 411, and further extends toward the lead frame 413. The bonding wire 416 is configured such that the outer diameter d of the bonding wire 416 and the loop height L2 ($h$) from the pad 418 to the lowest point of the bend satisfy the relation of $20 \times d \leq h$. Therefore, even if the relative displacement occurs between the package 423 and the inner unit 411, deformation of the bonding wire 416 is reduced. With this, damage to the bonding wire 416 is reduced. Therefore, the strength and the durability of the physical quantity sensor 410 improve. Further, even if an impact is excessively applied to the physical quantity sensor 410 during in use on a vehicle, the physical quantity sensor 410 will not be damaged and properly operates.

Since the loop height L2 is set equal to or lower than 1.0 mm, the resonance frequency of the bonding wire 416 does not overlap the resonance frequency of the vibration isolating member 415. As such, the bonding wire 416 will not affect the vibration isolation property of the vibration isolating member 415.

Accordingly, the vibration is effectively reduced by the vibration insulating member 415 and the strength and the durability of the bonding wire 416 improve.

In the second embodiment, similar to the first embodiment, the outer diameter d of the bonding wire 416 can be in the range of 0.020 to 0.040 mm including 0.030 mm (i.e., $0.020 \leq d \leq 0.040$ mm). In this case, by setting the loop height L2 ($h$) to satisfy the relation of $20 \times d \leq h$, the strength and the durability of the physical quantity sensor 410 improve.

Additional advantages and modifications will readily occur to those skilled in the art. The invention in its broader term is therefore not limited to the specific details, representative apparatus, and illustrative examples shown and described.

What is claimed is:

1. A physical quantity sensor comprising:
   a sensing portion;
   a casing including a support portion opposed to an end wall of the sensing portion for supporting the sensing portion, the support portion defining a support surface adjacent to the end wall of the sensing portion;
   a vibration isolating member disposed between the end wall and the support surface to join the sensing portion to the casing, the vibration isolating member being configured to reduce a relative vibration between the sensing portion and the casing;
   an electrically conductive portion provided on the casing;
   a pad provided on the sensing portion; and
   a bonding wire electrically connecting the electrically conductive portion and the pad and including a bend to be convex in a direction opposite to the support surface, wherein
   the bonding wire is configured to satisfy a relation of $20 \times d \leq h$, in which d is an outer diameter of the bonding wire and h is a height of the bonding wire from the pad to a highest point of the bend.

2. The physical quantity sensor according to claim 1, wherein
   the physical quantity sensor is one of an angular velocity sensor for detecting an angular velocity in a direction of rotation centering an axis of the sensing portion, an acceleration sensor for detecting a change in acceleration and an inertia force sensor provided by a combination of the angular velocity sensor and the acceleration sensor.

3. A physical quantity sensor comprising:
   a sensing portion;
   a casing encasing the sensing portion therein, the casing providing a clearance between an inner surface thereof and an outer wall of the sensing portion;
   a vibration isolating member disposed in at least a portion of the clearance to join the sensing portion to the casing, the vibration isolating member being configured to reduce a relative vibration between the sensing portion and the casing;
   an electrically conductive portion provided on the casing;
   a pad provided on a surface of the sensing portion; and
   a bonding wire electrically connecting the electrically conductive portion and the pad and including a bend, wherein
   the bonding wire is configured to satisfy a relation of $20 \times d \leq h$, in which d is an outer diameter of the bonding wire, and h is a height of the bonding wire from the pad to a highest point of the bend.

4. The physical quantity sensor according to claim 3, wherein
   the physical quantity sensor is one of an angular velocity sensor for detecting an angular velocity in a direction of rotation centering an axis of the sensing portion, an acceleration sensor for detecting a change in acceleration and an inertia force sensor provided by a combination of the angular velocity sensor and the acceleration sensor.

5. A physical quantity sensor comprising:
   a casing,
   an inner unit housed within the casing and including a sensor portion;

a vibration isolating member disposed between the casing and the inner unit to join the inner unit to the casing, the vibration isolating member being configured to reduce a relative vibration between the inner unit and the casing;

a bonding wire electrically connecting the inner unit and the casing and including a bend away from a bottom surface of the inner unit, wherein the bonding wire is configured to satisfy a relationship of $20 \times d \leq h$, in which d is an outer diameter of the bonding wire and h is a height of the bonding wire from the bottom surface of the inner unit to a point of the bend in the bonding wire farthest from the bottom surface of the inner unit.

\* \* \* \* \*